(12) United States Patent
Boeve (10) Patent No.: US 8,134,881 B2
(45) Date of Patent: Mar. 13, 2012

(54) THERMALLY STABLE REFERENCE VOLTAGE GENERATOR FOR MRAM

(76) Inventor: Hans Marc Bert Boeve, Hechtel-Eksel (BE)

( * ) Notice: Subject to any disclaimer, the term of this patent is extended or adjusted under 35 U.S.C. 154(b) by 34 days.

(21) Appl. No.: 12/765,897

(22) Filed: Apr. 23, 2010

(65) Prior Publication Data

US 2010/0202231 A1     Aug. 12, 2010

Related U.S. Application Data

(62) Division of application No. 11/547,336, filed as application No. PCT/IB2005/051051 on Mar. 29, 2005, now Pat. No. 7,733,729.

(30) Foreign Application Priority Data

Apr. 1, 2004   (EP) ..................................... 04101352

(51) Int. Cl.
   *G11C 7/02*      (2006.01)
   *G11C 7/04*      (2006.01)
(52) U.S. Cl. ................. 365/210.1; 365/210.15; 365/211
(58) Field of Classification Search ............... 365/210.1, 365/210.15, 211
   See application file for complete search history.

(56) References Cited

U.S. PATENT DOCUMENTS

| | | | |
|---|---|---|---|
| 4,524,431 A | 6/1985 | Haken et al. | |
| 5,022,031 A | 6/1991 | Baggen | |
| 5,719,808 A | 2/1998 | Harari et al. | |
| 5,999,439 A | 12/1999 | Seyyedy | |
| 6,445,612 B1 | 9/2002 | Naji | |
| 6,600,690 B1 | 7/2003 | Nahas et al. | |
| 6,621,729 B1 | 9/2003 | Garni et al. | |
| 6,704,230 B1 | 3/2004 | DeBrosse et al. | |
| 7,038,950 B1 | 5/2006 | Hamilton et al. | |
| 7,266,009 B2 * | 9/2007 | Chandler et al. | 365/145 |
| 7,286,429 B1 * | 10/2007 | Liaw et al. | 365/209 |
| 7,466,592 B2 * | 12/2008 | Mitani et al. | 365/185.2 |
| 2002/0008987 A1 | 1/2002 | Numata et al. | |
| 2002/0159308 A1 | 10/2002 | Fournel et al. | |

(Continued)

FOREIGN PATENT DOCUMENTS

WO    WO2004/049343    6/2004

OTHER PUBLICATIONS

Tehrani et al.,: "Magnetoresistive Random Access Memory Using Magnetic Tunnel Junctions", Proceeding of the IEEE, vol. 9, No. 5, 1, p. 703-714 (2003).

*Primary Examiner* — Ly D Pham
(74) *Attorney, Agent, or Firm* — Cooley LLP (57) ABSTRACT

A non volatile memory device comprises memory cells such as MRAM cells, reading circuits and a reference cell for generating a reference for use by the reading circuits, and can determine if the reference is degraded by thermal instability. This can help reduce a data error rate. Detecting such degradation can prove to be more effective than trying to design in enough margins for the lifetime of the device. The reference cell can be less susceptible to degradation than other cells by using different shape of cells and different write currents. Where each reference cell is used by many memory cells, the reference cell tends to be used more often than any particular memory cell and so can be more susceptible to degradation. Another way of ensuring against longer term degradation of the reference is periodically rewriting the reference cell.

15 Claims, 5 Drawing Sheets

U.S. PATENT DOCUMENTS

| | | |
|---|---|---|
| 2003/0031045 A1* | 2/2003 | Hosotani ................ 365/158 |
| 2003/0086314 A1 | 5/2003 | Okazawa et al. |
| 2004/0017718 A1 | 1/2004 | Ooishi |
| 2004/0228198 A1* | 11/2004 | Shimizu ................ 365/232 |
| 2004/0233716 A1 | 11/2004 | Tran et al. |
| 2006/0092699 A1 | 5/2006 | Higashi et al. |
| 2006/0114738 A1 | 6/2006 | Lee |
| 2006/0274576 A1 | 12/2006 | Redaelli |
| 2007/0014172 A1* | 1/2007 | Hidaka ................ 365/210 |
| 2007/0113150 A1 | 5/2007 | Resnick |

* cited by examiner

THERMALLY STABLE REFERENCE VOLTAGE GENERATOR FOR MRAM

This invention relates to non-volatile memory devices, MRAMs, to systems containing such memory devices, and methods of operating such devices.

Thin film Magnetoresistive Random Access Memory (MRAM) is one example of a number of NVM (non volatile memory) technologies. MRAMs can be fabricated in a variety of memory cell embodiments, including a Magnetic Tunneling Junction (MTJ) element. The MTJ element essentially consists of a pair of magnetic layers with an insulating layer sandwiched in between. One of the magnetic layers has a fixed magnetic vector and the other magnetic layer has a changeable magnetic vector that is either aligned with or opposed to the fixed magnetic vector. When the magnetic vectors are aligned, the resistance of the MTJ element, i.e. the resistance to current flow between the magnetic layers, is a minimum and when the magnetic vectors are opposed or misaligned the resistance of the MTJ element is a maximum.

Data is stored in the MTJ element by applying a magnetic field to the MTJ element directed so as to move the changeable magnetic vector to a selected orientation. Generally, the aligned orientation can be designated a logic 1 or 0 and the misaligned orientation is the opposite, i.e., a logic 0 or 1. Stored data is read or sensed by passing a current through the MTJ element from one magnetic layer to the other. The amount of current passing through the MTJ element, or the voltage drop across the MTJ element, will vary according to the orientation of the changeable magnetic vector.

The scaling of MRAM and other NVM technology is an important aspect for its future success as a unified memory technology, combining speed, density, and non-volatility. Two key problems relate to the scaling issue:
1. current densities in the current lines used for writing are limited, hence a maximum write current level should not be exceeded for a given CMOS technology, and
2. a thermal stability problem occurs when the stored data in magnetic memory cells become unstable over time due to thermal relaxation.

The magnetic anisotropy-magnetic volume product $K_u \cdot V$ is the important figure-of-merit in the thermal stability analysis. However, when scaling MRAM technology, for a fixed free layer thickness, the magnetic volume scales along with the device area, i.e. by a power (−2) or $1/S^2$, with S the scaling factor of the semiconductor technology, and the anisotropy needs to be constant or smaller to keep the required write fields within the available current density. The latter constraint has been met so far by reducing the aspect ratio of the memory elements. For the memory cells, different measures can be taken to overcome or at least cope with weaker cells such as error correction schemes, in combination with redundancy, or rewriting data tracks at regular time intervals, or a combination of these.

Figure 1:
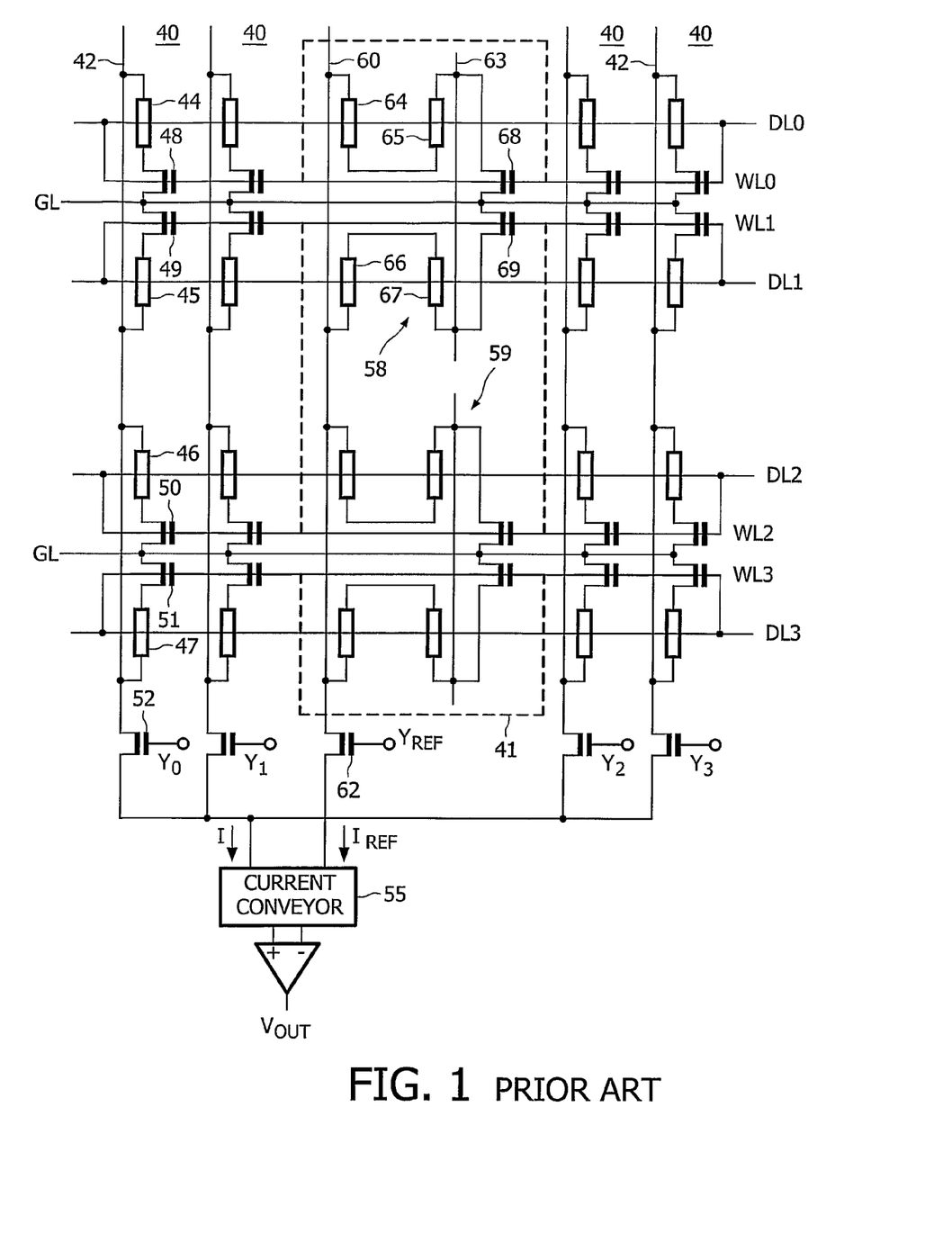
FIG. 1 shows a prior art MRAM device.

During a read operation, the data signal of a memory cell is compared to a signal provided by a reference voltage generator. When read out, the reference voltage generator yields a voltage half-way between the output voltages corresponding to the logical 0 and 1. An example of an MRAM device with a midpoint generator reference is shown in U.S. Pat. No. 6,445,612 by P. Naji (Motorola) and in, Proceedings of the IEEE, Vol. 91, No. 5, May 2003, pp. 703-14 by Tehrani et al, and is illustrated here in FIG. 1. FIG. 1 schematically represents a 1T1MTJ circuit comprising a reference column 41 and nearby memory array blocks. The reference column 41 is used by the read circuitry for comparison to the target cells along the same row to determine the resistance state of a given target cell. In this case, the reference column 41 has reference cells each consisting of a series-parallel combination of four devices, where two elements are programmed high and two are programmed low. From here, the read circuitry determines whether the target cell is above or below the midpoint to determine the memory state.

In FIG. 1, the reference column 41 is embedded in a plurality of data columns, each designated 40, forming a single data block. Each data column 40 includes a bitline 42 having pairs of non-volatile magnetoresistive memory elements 44 and 45, and 46 and 47 connected thereto by means of control or activating transistors 48 through 51, respectively. Elements 44 through 47 are MTJ memory cells represented as resistances. Each element 44 through 47 is programmable to one of an Rmax and an Rmin state, in a manner well known in the art, to operate as a memory. Bitline 42 is connected through a column select transistor (or switch) 52 to one input of a read-out circuit, which includes a current conveyor circuit 55, which feeds a differential amplifier.

Current conveyor circuit 55 includes individual components that have a very low input impedance, isolating bitlines 42 from any high output impedance of current sources. The low input impedance combined with the clamping of bitlines 42 to $V_{bias}$ limits the voltage swing of bitlines 42 to achieve high speed readout for very high density MTJ arrays. Current conveyor circuit 55 provides and maintains a constant bias across bitlines 42 regardless of operating temperatures, changes in the supply voltage, and process conditions. Also, current conveyor circuit 55 provides a small swing in the voltage on bitlines 42 to allow for high speed operation. The term "current conveyor" is intended to include any other device that performs the described functions. e.g., current sensors, current sense amplifiers, pre-amplifiers, etc.

Reference column 41 includes two midpoint generator cells 58 and 59 coupled to a reference bitline 60. Reference bitline 60 is connected through a column select transistor (or switch) 62 to a second input of current conveyor circuit 55. Midpoint generator cell 58 includes a plurality of non-volatile magnetoresistive elements 64 through 67 each having an Rmax state and an Rmin state and each being set to one of Rmax and Rmin. Magnetoresistive elements 64 and 66 are set to Rmax and magnetoresistive elements 65 and 67 are set to Rmin. Further, magnetoresistive elements 64 and 65 are connected in a first series circuit between the input terminal (bitline 60) and the output terminal (line 63) of cell 58 and magnetoresistive elements 66 and 67 are connected in a second series circuit between the input terminal (bitline 60) and the output terminal (line 63) of cell 58. Magnetoresistive elements 64 through 67 are connected together to provide a total resistance of a midpoint resistance between Rmax and Rmin. Similarly, midpoint generator cell 59 includes a plurality (in this embodiment four) of non-volatile magnetoresistive elements connected together to provide a total resistance of a midpoint resistance between Rmax and Rmin. Two control transistors 68 and 69 are connected to direct current flow through cell 58.

Having the reference cells in close proximity and identical to the array devices solves several potential problems. The close proximity ensures that the reference will track any variations in the resistance over the wafer, such as those due to small changes in the tunnel barrier thickness or patterned magnetic element area. Since the reference elements are identical to the memory elements, variations in resistance due to operating temperature or other external factors will closely track the active elements. The resulting resistance is $$(R_{max}+R_{min})\|(R_{max}+R_{min})=\tfrac{1}{2}(R_{max}+R_{min}),$$

which is the midpoint between $R_{max}$ and $R_{min}$.

The read operation for the MRAM circuit of FIG. 1 is as follows. A memory cell is selected by driving the word line voltage high, selecting a column (bitline), and turning on all ground switches. A current conveyor is shared by a block of bitlines and every reference bitline has its own current conveyor. Once the current conveyors are turned on, they clamp the target bitlines and reference bitlines to the respective voltages, take the resulting target and reference bitline currents, and convert them to a voltage signal with substantial boost. The target and reference current conveyors form a differential pair and their outputs are fed into a differential comparator followed by a regenerator, which again boosts the signal. The read circuitry has been designed to achieve high bandwidth, maintain offset insensitivity, and consume minimal silicon area.

U.S. Pat. No. 6,445,612 also shows a differential read-out circuit is coupled to the data column and to the reference column for differentially comparing a data voltage to a reference voltage. The magnetoresistive elements of the plurality of data columns and the magnetoresistive elements of the plurality of reference columns are generally similar. The reference column including midpoint generators is capacitively very close to the adjacent data columns. As a result, all time varying signals in the data and reference columns track very closely, resulting in high speed read processing. Because of the improved reference columns with midpoint generators, circuit operation is faster and more reliable. Because of the improved reference columns with midpoint generators, read access is fast and the architecture is robust and reliable to match that of SRAM performance.

In U.S. Pat. No. 6,445,612 a change of state of one of the four elements involved in the reference design will lead to a shift away from the reference level from ~50% (compared to a logic 1, e.g. low state (0%) and logic 0 high state (100%)), to result in new reference states close to 25% or 75%. This bit-flip can be induced by thermal instability, e.g. during normal operations or, alternatively, induced by a brief exposure to a very moderate magnetic field. For a permanent, non-volatile change in the reference level, a dramatic decrease in the readout margin is anticipated, probably beyond available margins in advanced non-volatile semiconductor technologies.

It is known from US patent application 2003/0086314 A1 to reduce the effect of variation of electrical performance at different places on an MRAM or an FRAM (Ferroelectric random access memory) device by using an electrical state of a memory cell as a reference where that memory cell is nearer than the reference cell.

Furthermore, it is known from U.S. Pat. No. 6,621,729 that there is a need for a sensing circuit for MRAM using a midpoint reference using a minimum of area, providing a true nearby midpoint reference, with symmetry in the circuit path for balanced loading including parasitic capacitances and resistances. The document suggests a sense amplifier which develops internally a midpoint reference current from two reference elements. The midpoint reference current is used to sense the state of a memory cell having at least two distinct resistance states (H and L) by determining whether the sense memory cell develops a larger or smaller current. The midpoint reference current is developed within a single sense amplifier. Predetermined bias voltages are developed from each of a data cell, a reference cell programmed to a high state and a reference cell programmed to a low state. Currents are developed from the bias voltages and summed to create the midpoint reference current. A current differential amplifier senses whether the bit input has a high or low resistive state and outputs a voltage indicative of the sensed memory state.

U.S. Pat. No. 6,600,690 shows an MRAM in which a sensing system detects bit states using one data and two reference inputs, to sense a difference in conductance of a selected memory cell and a midpoint reference conductance. Reference conductance is generated as the average conductance of a memory cell in the high conductance state and a memory cell in the low conductance state. The data input is coupled to the selected memory cell. The two reference inputs are respectively coupled to memory cells in high and low conductance memory states. The sense amplifiers use either current biasing or voltage biasing to apply a sensing voltage within a predetermined voltage range across the memory cells. Capacitance coupled to complementary outputs of the sense amplifiers is balanced by the circuit designs. In one form, the two reference inputs are internally connected. One of several gain stages amplifies the sense amplifier output without injecting parasitic errors.

However, there still remains a need for improved error rates particularly for memory technologies with long term stability issues.

It is an object of the present invention to provide improved devices and methods.

The above objective is accomplished by methods and devices according to the present invention.

According to a first aspect, the invention provides a non-volatile memory device comprising a number of memory cells, which may comprise at least one memory element, for providing data signals representative of stored data values, at least one dedicated reference cell, which may comprise at least one reference element, for generating a reference signal and a reading means or circuitry for determining data values from the signals read from the memory cells and from the at least one reference cell, the device further comprising a reference degrade detector means for determining if the reference signal is degraded. Degradation can be determined by reference to a timer, i.e. a certain elapsed time, or by comparison with a further reference signal, or if there is more than one reference cell, then the reference signals from all the reference cells can be compared and degraded cells determined as differing by a threshold value from other reference cells or the average of the reference signals. Another detection of degradation may be based on e.g. the data. When an excessive amount of errors is detected in the data that may be encoded, it may be concluded that the reference signal may be degraded. Hence, degradation may be detected by determining abnormal levels of data errors by means of for example a data error detection and correction system of a non-volatile memory device.

Data values are determined by the comparison of the raw data with the reference signal.

In an aspect of the present invention the means for determining if the reference is degraded may comprise a reference test structure. This can provide a more direct determination, and can be used in combination with other techniques.

In an embodiment of the present invention, the reference may comprise a midpoint reference. This is appropriate for binary logic and so is commercially the most significant type of reference, since most systems currently use binary logic.

In one embodiment, the reference test structure may comprise a test cell which is more susceptible to degradation than the reference cell and a means for indicating that the reference signal is degraded based on detecting a degradation in the test cell. This may enable the degradation to be detected more readily, and in some cases before it has an effect on read data errors. Hence, it may enable remedial action to be taken before data errors occur. Optionally, this may enable other design parameters or margins to be relaxed, with less risk of data errors over the lifetime of the device. As before, this may be combined with other techniques.

Since reliable memory operation depends on correctness of the reference, the bit error rate can be kept low if any degradation including potential stability problems of the reference is detected. There are a number of ways of reacting once a problem is detected, and some are described below. Detecting such degradation may prove to be more effective than trying to anticipate every degradation and design in enough margin for the entire lifetime of the device.

The device according to the present invention may furthermore comprise a reference rewrite means or circuit for rewriting the reference cell if it is determined to be degraded. Hence, the device may comprise means for regenerating the reference before reading the data values from the memory cells if the reference is found to be degraded. This is particularly useful for addressing degradation such as long term instability of the reference cell. For some NVM technologies at least this may lead to better scalability and contribute towards the ideal of a unified memory technology, combining speed, density, and non-volatility. It may help address degradations such as thermal instability within limitations of current densities in current lines used for writing.

In another embodiment, the device may furthermore comprise a data error detection and correction means for detecting and correcting errors in the read data values. The device according to this embodiment may help to further reduce errors and in particular embodiments the amount of read data errors detected may be used to detect degradation in the reference. Moreover, if regenerating the reference does not change the amount of read data errors, it may be deduced that the reference is not the source of the errors.

In another embodiment, the reference degrade detector means for determining if the reference is degraded may comprise a detector means for detecting errors in the read data values. This is a less direct technique since there may be other causes of data errors. Nevertheless, this may be useful since data errors are one of the most important parameters and relatively easy to measure.

In yet another embodiment, the reference cell may be arranged to be less susceptible to the degradation than the memory cells. This may further reduce the risk of data errors. It may however involve a cost in terms of chip area or other parameters, but nevertheless may be worthwhile especially where each reference cell is used by more than one memory cell.

A second aspect of the invention provides a non volatile memory device comprising a number of memory cells for providing data signals representative for stored data value, at least one reference cell for generating a reference signal and reading means or circuitry for determining the data values from the signals read from the memory cells and from the at least one reference cell, the reference cell being arranged to be less susceptible to degradation than are the memory cells.

This may however also involve a cost in terms of chip area or other parameters, but may nevertheless be worthwhile, especially where each reference cell is used by many memory cells. In such cases the reference cell may tend to be used more often than any particular memory cell and so may be more susceptible to degradation. It may be used as an alternative to providing a reference degrade detector means for determining when the reference is degraded, to save chip area or other resources, or may be used in combination with such techniques to further improve data error rates.

A memory cell and a reference cell may comprise at least one memory element resp. reference element. The at least one reference element in the reference cell may have a larger size than the at least one memory element in the memory cell. This is one way to achieve less susceptibility to degradation. Another way to achieve less susceptibility to degradation may be a different shape and a different shape anisotropy for the at least one reference element in the reference cell compared with the at least one memory element in the memory cell. This can be another way to achieve less susceptibility to degradation. Hence, to decrease susceptibility to degradation it is preferable to increase the product $K_u \cdot V$. By increasing the size of a reference element, $V$ is increased. A larger $V$ is hence achieved for the same value of $K_u$ and thus the product $K_u \cdot V$ is increased as well. On the other hand, when changing the shape and shape anisotropy of a reference element, a larger value for $K_u$ may be achieved for the same volume $V$. In that way, the product $K_u \cdot V$ may be increased as well.

Less susceptibility to degradation may also be achieved when the write current used for generating a local magnetic field required for performing a programming operation on the reference cell is made larger than the corresponding write current for performing a programming operation on the memory cells.

In a further embodiment of the invention, a write current may be used for generating a local magnetic field required for performing a programming operation on the reference cell. The magnetic field may comprise a component which is shared with the memory cells and a component which is not shared with the memory cells, the shared component being smaller than the non-shared component. This is a way to achieve less susceptibility to degradation for the reference cells with less impact on the memory cells and their design and operating parameters. Another such additional feature is the degradation comprising thermal instability. This is one long term source of data errors which tends to become more significant as the size of the devices is scaled down. Hence, it is important to address this to ensure scalability.

A third aspect of the invention provides a non-volatile memory device comprising a number of memory cells for providing data signals representative for stored data values, at least one reference cell for generating a reference signal, reading means for determining the data values from the signals read from the memory cells and means for periodically rewriting the reference cell.

This may be another way of ensuring against longer term degradation of the reference. It may be carried out as an alternative to the other techniques, or in combination with any of them.

In a further embodiment of the invention, the device may comprise an MRAM. This is one of the commercially more significant NVM technologies.

Another aspect of the invention provides a system having a power source, a processor and a number of memory devices according to any of the aspects set out above in accordance with the present invention. This reflects that the memory devices set out above may affect speed and power consumption for example, so the benefits may be seen at the system level. The increased value of such systems and of applications running on such systems may be far greater than the sales value of the memory devices.

Another aspect of the present invention provides a method of operating a memory device having a number of memory cells for providing data signals representative for stored data values, and reading circuitry for reading the memory cells using a reference signal to determine data values of the memory cells, the method comprising the steps of determining if the reference signal is degraded, and if so, then regenerating the reference before reading the data values from the memory cells.

In another embodiment, the method may furthermore comprise detecting errors in the read data values. In yet another embodiment, the method may furthermore comprise determining if the reference is degraded by using a built in test structure.

The additional features may be combined with each other and with any of the aspects as would be apparent to those skilled in the art. Other advantages to those set out above will be apparent, especially in relation to other prior art not known to the inventors. How the present invention may be put into effect will now be described with reference to the appended schematic drawings. Obviously, numerous variations and modifications can be made without departing from the spirit of the present invention. Therefore, it should be clearly understood that the form of the present invention is illustrative only and is not intended to limit the scope of the present invention.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference signs refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated. Hence, the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

In the following description and in the claims, the term 'bit' refers to data in the memory cell. The term 'cell' refers to a memory cell or a reference cell. Furthermore, a memory cell or a reference cell may comprise a plurality of memory elements resp. reference elements.

Reliable memory operation depends on the data retention of memory cells, but also on the stability of all magnetic tunnel junctions in the reference generator. It has now been appreciated that reference cells can be exposed to a multitude of so-called half-selects, when write operations are performed on neighbouring memory elements. During a half-select, one of the two field components required for a reliable write operation is present, so that switching is not expected to occur. However the energy barrier against non-intended switching due to thermal fluctuations is lowered during a half-select, so that, statistically speaking, the (already not-zero) probability for switching is strongly increased. The occurrence of external magnetic fields, or high temperature, will reduce the energy barrier against switching even further, hence leading to a loss of data retention, and possibly loss of reference bit retention.

A solution using a specific test structure has been disclosed in part in co-pending non-prepublished application with filing number WO 2003IB05018, where it was proposed to add specific test structures to MRAM chips that are able to detect the onset of thermal relaxation. The test structure was based on a regular array of magnetic memory elements with a smaller anisotropy-volume product that do relax faster than the memory elements in the MRAM array would do. As a result of the detection of the onset of thermal relaxation, the elements in the mid-point voltage reference cell first need to be rewritten (so that read operations can be done reliably again), after which the integrity of the data in the memory array can be checked, using the implemented error correction schemes, if available. Any corrupted data can then be re-written. An advantage when the elements in a reference cell are identical to other memory elements is that they can be manipulated in the same way as memory elements, hence they can be written (or re-written) at regular time intervals.

There are alternatives if there is no direct test-structure that is able to check the correctness of the midpoint generator, making it difficult to define when a re-write operation is necessary. An abnormal amount of data read errors can be detected and used to trigger a re-write of the midpoint voltage reference. Or a re-write operation for the reference elements can be scheduled to occur periodically.

The present invention provides another alternative, which is described in more detail below. The idea of this embodiment is to make the reference elements different to the memory elements to make them more resilient to the degradations, such as for example thermal instability. Any of these various alternatives can be combined in any way.

Figure 2:
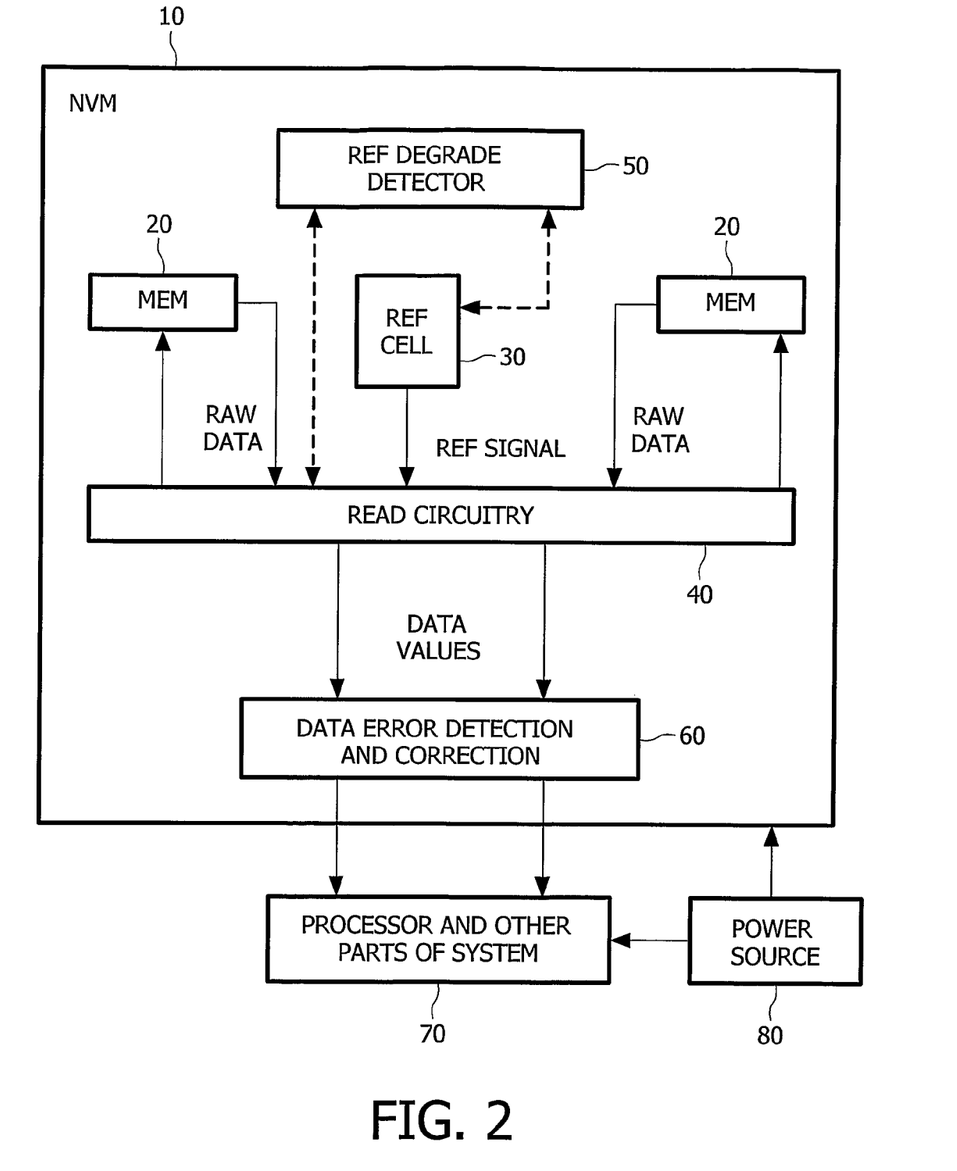
FIG. 2 shows in schematic form some elements of a system including an NVM according to an embodiment of the invention.

FIG. 2 System Having NVM According to an Embodiment

FIG. 2 shows some of the principal elements in a system according to an embodiment of the present invention, comprising an NVM 10, a power source 80, and a processor and other parts of the system 70. The power source 80 may for example be implemented in the form of a battery for mobile systems, or a power converter, e.g. a DC/DC or AC/DC converter or transformer and other elements for conditioning electricity supplied from a public supply for example. The processor 70 may be exemplified by any known general purpose microprocessor or other digital circuitry for example.

The NVM device 10 according to the present invention comprises a number of memory cells 20, a reference cell or cells 30 and read circuitry 40. The reference cell or cells 30 output a reference signal or signals to the read circuitry 40 for use in deciding or determining a data value of raw data output by or extracted from the memory cells 20. Deciding or determining a data value of raw data output may be performed by determining which data value from a limited set of data values, e.g. from the set of binary values 0, 1, is represented by the memory cell 20. Herefore, a threshold detection can be performed during read operation. The output of the memory cell 20 is in fact compared to a reference value.

Degradation in the reference signal is detected by a reference degrade detector 50. Data values decided or determined by the comparison of the raw data with the reference signal, typically binary values, are output to a data error detection and correction part 60. The corrected data values are output to the processor and other parts of the system 70. The read circuitry 40 causes a read operation by addressing the memory cells 20 according to established practice, which need not be described here in more detail.

The memory cells 20 may be implemented using, for example, MRAM technology, such as for example MTJ elements, as described in more detail in the documents referenced in the background section above. However, other implementations may be possible, including FRAM, and any other NVM technology which uses reference signals generated by reference cells 30 similar to the memory cells 20. The reference degrade detector 50 may be implemented in various ways. For example, it can detect degradation by determining abnormal levels of data errors by the data error detection and correction part 60.

Alternatively, or in combination, the reference degrade detector 50 may test the operation of the reference cell 30 or the reference signal more directly. It may for example comprise reference test cells which are more susceptible to degradation, such as long term thermal instability, than the reference cells 30.

The reference degrade detector 50 is shown as being coupled by a dotted line to the read circuitry 40. This is an optional connection, which may be used to suppress the operation of the read circuitry 40 if the reference signal is determined to be degraded. Other reactions to a degrade detection could be to switch to using a different reference signal for example, which is however not a preferred embodiment of the present invention, or rewriting the reference in the relevant reference cell 30 before continuing with or repeating the current read operation. Another option may for example be to repeat the read operation a number of times to obtain a statistical average.

Figure 3:
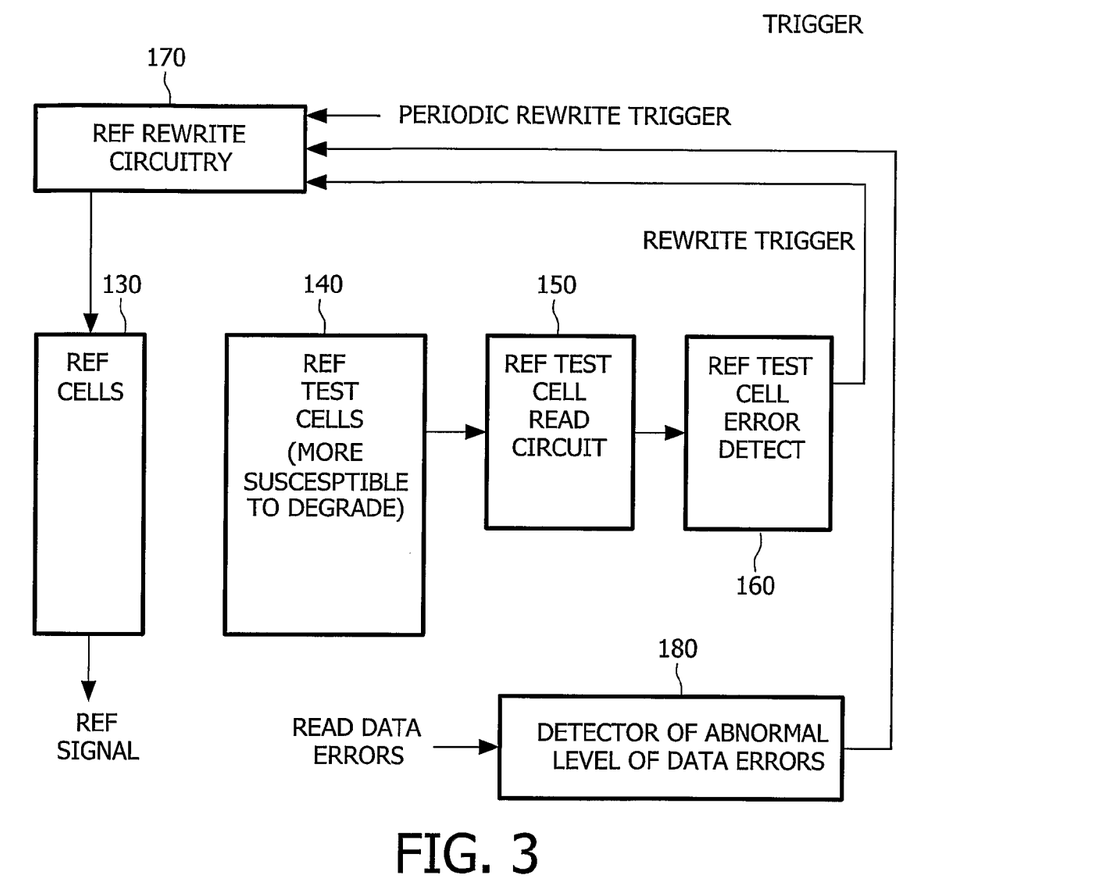
FIG. 3 shows some of the principal elements of another embodiment.

FIG. 3, Parts of NVM According to Another Embodiment

FIG. 3 shows reference cells 130 for generating a reference signal or signals such as for example a midpoint reference, as in FIG. 2 and as described in more detail in FIG. 1 for the case of an MRAM device. Also shown in FIG. 3 is a reference test cell or cells 140 which are more susceptible to degradation than the reference cells 130 used by the read circuitry 40. These reference test cells 140 are coupled to reference test cell read circuit 150 which reads the reference test cells 140. The output terminal of the reference test cell read circuit 150 is connected to a reference test cell error detector 160. If an error, such as for example a value outside of the normal range, is detected by the test cell error detector 160, the error detector 160 will output a trigger signal to a reference rewrite circuit 170. Such errors may, for example, be caused by thermal instability. The reference rewrite circuit 170 may also be triggered in other ways, either as an alternative, or in combination with the trigger from the reference test cells 140. As shown, there is a periodic rewrite trigger signal generated sufficiently often to overcome or ameliorate the effects of long term degradations such as for example thermal instability, even if no other trigger is generated. Also shown is a detector 180 for detecting an abnormal level of data errors based on the read data values output by a data error detection and correction part 60. The data detection and/or correction may be carried out using a number of conventional techniques which are known by a skilled person and hence, do not need to be described here in more detail.

Figure 4:
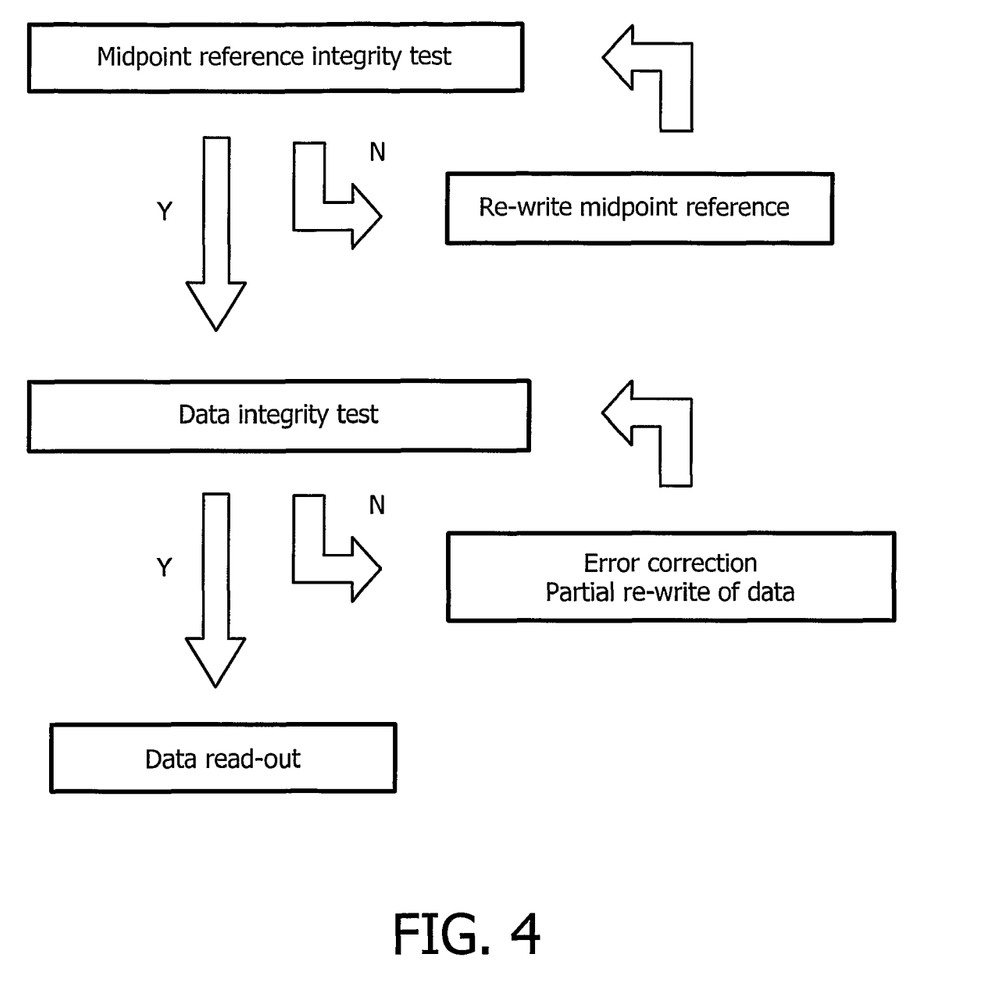
FIG. 4 shows in schematic form some of the functions of another embodiment.

FIG. 4, Overview of Procedure for Integrity Testing in NVM

In another aspect of the invention, a method for operating a NVM device 10 is provided. A first step in a read-out operation of a NMV device 10 is to carry out a midpoint reference integrity test, using, for example, any of the techniques described above. If this midpoint reference integrity test fails, then the midpoint reference cells 130 are rewritten and the integrity test is carried out again. The midpoint reference integrity test fails if certain criteria are met, in particular when specific margins for reliable read out are exceeded. In the output levels corresponding to logic values 1, 0 of data, statistical distributions are present. Furthermore, a statistical distribution exists for the reference level as well. Both statistical distributions are a function of time, and, in case of multiple reference cells, statistical distributions are also a function of location. As soon as the expected distribution of the reference level overlaps with the extreme values for the output levels corresponding to the logic values 1, 0 of the data, erroneous data values will be read. The integrity test is expected to give a 'pass' in normal operation regime. This involves the influence of small process variations but also limited not-optimal conditions, such as e.g. small temperature changes or the presence of a small magnetic field. Larger deviations clearly need to trigger a 'fail'. The fail criteria may for example be a 10 to 20% deviation form the original level.

Once the device 10 has passed the midpoint reference integrity test, the next step in the read-out operation is a data integrity test. This data integrity test may use any suitable conventional data error detection technique, such as for example in U.S. Pat. No. 5,719,808, which describes an EEPROM with error correction or in U.S. Pat. No. 5,022,031 which a RAM which is error protected by a spatial convolutional code. If this test is failed, error correction involving a partial rewrite of the data may be carried out. Again this can make use of conventional error correction techniques, using redundant data typically. Once the error is corrected, the data integrity test may be carried out again, and once the device 10 has passed the test is, the data is read out from the NVM 10.

Many variations are conceivable on this procedure, to suit the circumstances. For example the midpoint reference integrity test may be carried out periodically, or as part of every read operation. The data integrity test may be carried out only when an external device requests readout of data, or may be carried out periodically without awaiting a read request from an external device.

FIG. 4 illustrates a general procedure for a read-operation. The midpoint reference integrity test may be based on one of the above embodiments, i.e. based on for example a specific test-structure, or may be deduced from the memory data itself, e.g. when too large an amount of errors has been detected. For a positive decision Y on integrity, the test is passed and data may be read out. For a negative decision N, the integrity test failed and the midpoint reference is re-written in the reference cells 30, after which the integrity test may be repeated, if required, so that a feedback loop is created. Upon a negative decision N, once the reference integrity prevails again, the data can be read and further measures, such as data recovery using error correction, can be undertaken.

Figure 5:
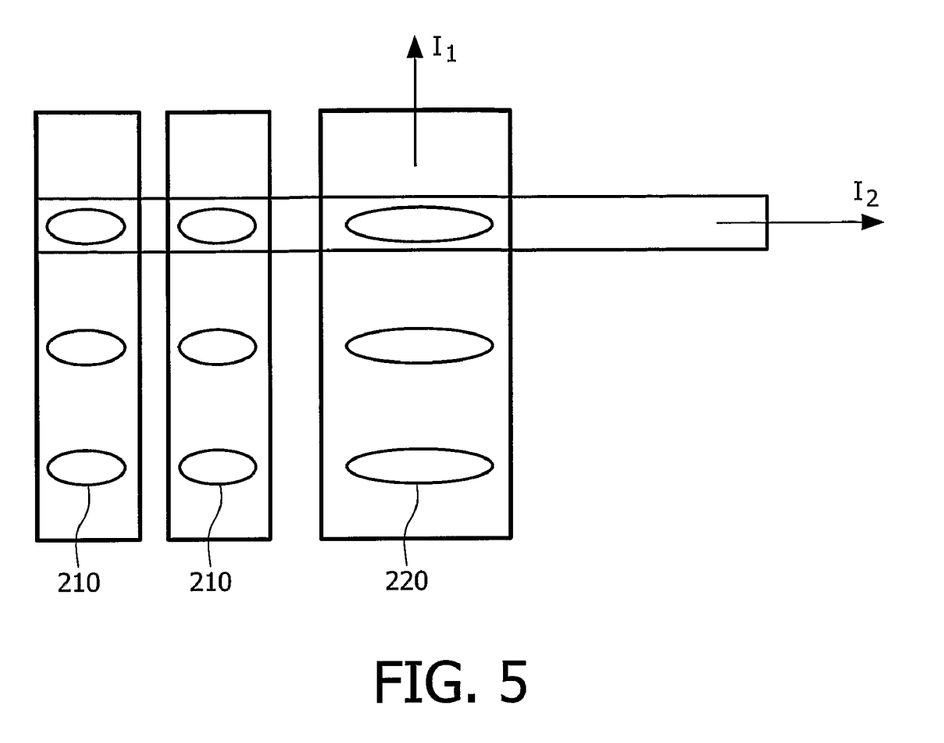
FIG. 5 shows in schematic form an embodiment of an MRAM having reference elements which are larger than the memory elements, according to another embodiment.
Figure 6:
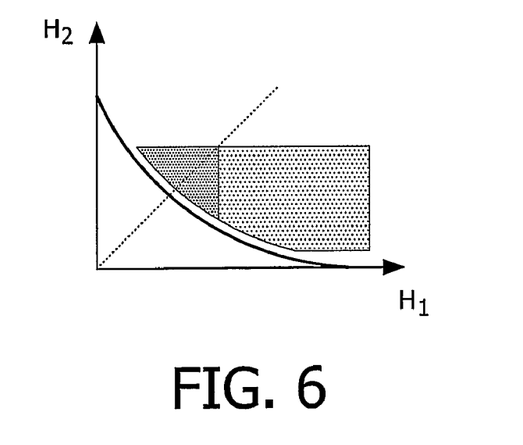
FIG. 6 shows a graph of writing current components for the embodiment of FIG. 5.

FIGS. 5 and 6, Memory Device with Different Reference Elements

FIG. 5 schematically shows memory cells 20 comprising a number of memory elements 210 arranged in columns, which may be implemented as shown in FIG. 1 for an MRAM. A reference cell 130 comprising a column of reference elements 220 is also shown, which may be arranged with respect to the memory elements 210 as shown in FIG. 1. As shown in FIG. 5, the reference elements 220 may be larger than the memory elements 210, and/or may have a different shape, in order to have a higher magnetic anisotropy $K_u$ compared to the memory elements 210. FIG. 5 also shows two currents $I_1$ and $I_2$ that can be used for generating the local magnetic field components $H_1$ and $H_2$ required for performing a programming operation on the reference elements 220. One of these components, i.e. $H_1$, is shared along a column of reference elements 220. The other, i.e. $H_2$, is shared across a row including one of the reference elements 220 and a memory element 210 from each of the columns of memory elements 210.

FIG. 6 shows a graph of the $H_1$ component as a function of the $H_2$ component of the generated effective magnetic field for the reference elements 220. The curve on the graph shows a minimum amount of each of the effective magnetic field components to give a sufficient effective magnetic field for writing. The dotted line represents the line of points where the two components are equal. The darker shaded triangle represents the window of available levels of each of the components given the usual limitations on the right current component levels for memory elements 210. The lighter shaded rectangular area to the right of the triangle shows the much larger window available if the limit on $I_1$ is relaxed for the reference elements 220 only.

FIGS. 5 and 6 show a solution involving bits stored in the reference elements 220 that are 'different' from other memory elements 210. Whereas in the earlier embodiments, reference test cell 140 elements with a smaller anisotropy-volume product $K_u \cdot V$ were chosen to be able to detect the onset of thermal stability, now the bits in the reference cell 130 or reference elements 220 are arranged such that their anisotropy-volume product $K_u \cdot V$ is larger than that of the elements in the memory cells 20 or the memory elements 210, hence their thermal stability will be better. As an example, reference elements are taken that have the same anisotropy (set by the shape anisotropy of the element), but are twice as large in size as the memory elements. As a result, the resistance of the reference element will be half the resistance of a memory element. By connecting two of those elements in series, these again have the same resistance as for the original reference element (or a memory element). However the doubling of the energy barrier ΔE relevant for thermal stability leads to the fact that the expected stability time $t_s$ is drastically increased. As an indication of lifetime, it has to be noted that the probability for switching in the time interval [0, $t_s$], P($t_s$), is equal to 63%, when $$t_s \approx \tau_0 \exp(\Delta E / k_B T) = \tau_0 \exp(K_u V / k_B T)$$

Since the anisotropy of the NVM device 10 is approximately the same, the required switching field will not be changed much, so that write operation on the reference elements does not have to be changed and remains compatible to write operations on memory elements.

Alternatively, the present invention includes choosing memory elements with a different shape anisotropy, e.g. with a different shape and/or with a larger volume, so that the shape anisotropy increases. As a result, the thermal stability of the reference cell or element may be drastically improved. Also, the write operation may be changed specifically for the reference elements. In conventional MRAM, it is for example possible to deviate from the 45 degree write angle, which would be giving the lowest effective magnetic field needed for writing. From a more complex analysis, it is possible to deduce that the darker triangle area in FIG. 6 represents the field window for reliable write operations in a memory array, combining reliable write operation on the selected magnetic element and sufficient stability for other magnetic elements on the same write lines against half-selects.

For the write operation on reference elements, the current or more generally the magnetic field component that is shared with other memory elements ($I_2$ or $H_2$) usually needs to be chosen within the same limits dictated by the memory cells 20, in order to meet the stability requirement of the memory elements during the half-select. The other current or magnetic field component $H_1$ however may be freely chosen, since no retention of other reference elements needs to be guaranteed, because all reference elements are set simultaneously, and memory elements in the memory matrix cannot be exposed to this half-select pulse. This results in a much larger write window for the reference elements, which is shown in FIG. 6 by the lighter shaded rectangular area. Note that in FIG. 5, the reference cells 130 may usually be implemented as two rows of reference cells 130, of which one row is written in the logical state 0, and the other row as 1, as described above with reference to FIG. 1.

Based on the embodiments discussed above, several options for dealing with potential thermal stability issues may be summarised as follows.

A first option is to provide a 'guaranteed' memory-lifetime stability of the reference cells 130 by using resilient reference elements 220. Since it is now expected that the thermal stability issue will be less stringent for the reference elements 220 in comparison to memory elements 210, the data will most likely be irreversibly corrupted when serious problems with the reference occur.

A second option is to extract any potential thermal stability issue in the reference directly from the data. When a substantial amount of 'errors' is being detected, e.g. in which way and how frequently the error correction schemes had to be applied, this can then be followed by re-writing the reference elements 220, after which data can be re-read. The amount of errors should be substantially reduced, if the problem had to do with the stability of the reference cells 130. This may also be implemented when memory elements 210 and reference elements 220 are identical.

A third option is to use specific test structures in MRAM chips. These may be used to detect the onset of thermal relaxation. As a result of detection, the elements 220 in the mid-point voltage reference cell 130 may be rewritten, so that read operations can be done reliably again, after which the integrity of the data in the memory array may be checked.

In the above, a test-methodology and device has been described for a reliable reference, e.g. midpoint reference in MRAM. Since reliable read operations primarily depend on the correctness of the values of the reference cells 130 or elements 220, it may be useful to detect and pre-empt any potential thermal stability problems of these cells 130 or elements 220. The test procedure first checks the integrity of the reference, after which data integrity is checked and eventually data can be read-out. Proposed solutions include either a regular re-write of the reference elements 220 or the use of reference elements 220 with a better thermal stability, i.e. a higher $K_u \cdot V$ value, from which a similar reference is deduced, or a combination of both.

As has been described above, a non-volatile memory device 10 comprises memory cells 20 such as for example MRAM cells, reading circuits 40 and a reference cell 30 for generating a reference for use by the reading circuits 40, and can determine if the reference is degraded by thermal instability. This can help reduce a data error rate. Detecting such degradation can prove to be more effective than trying to design in enough margins for the lifetime of the device. The reference cell 30 may be less susceptible to degradation than other cells by using different shape of cells and different write currents. Where each reference cell 30 is used by many memory cells 20, the reference cell 30 tends to be used more often than any particular memory cell 20 and so can be more susceptible to degradation. Another way of ensuring against longer term degradation of the reference is periodically rewriting the reference cell 30. Other variations may be conceived within the scope of the claims.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A non-volatile memory device comprising:
   memory cells for providing data signals representative of stored data values;
   at least one reference cell for generating a reference signal; and
   reading means for determining the stored data values from the data signals read from the memory cells and from the at least one reference cell, the at least one reference cell being arranged to be less susceptible to thermal instability than the memory cells.

2. The device according to claim 1, the at least one reference cell comprising at least one reference element and the memory cells comprising at least one memory element, wherein the at least one reference element in the at least one reference cell has a larger size than the at least one memory element in the memory cells.

3. The device according to claim 2, wherein the at least one reference element in the at least one reference cell has a different shape and a different shape anisotropy than the at least one memory element in the memory cells.

4. The device according to claim 1, wherein at least one write current used for generating a local magnetic field required for performing a programming operation on the at least one reference cell is larger than a corresponding write current used for generating the local magnetic field for performing the programming operation on the memory cells.

5. The device according to claim 4, wherein the at least one write current used for generating the local magnetic field for performing the programming action on the at least one reference cell has a component which is shared with the memory cells and a component which is not shared with the memory cells, wherein the component which is shared with the memory cells is smaller than the component which is not shared with the memory cells.

6. A non volatile memory device comprising:
   memory cells for providing data signals representative of stored data values;
   at least one reference cell for generating a reference signal;
   reading means for determining the stored data values from the data signals read from the memory cells; and
   a reference rewrite means for periodically rewriting the reference cell, wherein the reference cell is less susceptible to thermal instability than the memory cells.

7. The device according to claim 6, the device comprising a Magnetoresistive Random Access Memory (MRAM) an MRAM.

8. A system comprising
   a power source;
   a processor; and
   a number of the memory devices according to claim 6.

9. A method of operating a non volatile memory device having memory cells for providing data signals representative of stored data values and reading circuitry for reading the memory cells using a reference to determine the stored data values of the memory cells, the method comprising:
   determining if the reference is degraded by using a built-in test structure, and if so,
   regenerating the reference before reading the stored data values from the memory cells.

10. The method according to claim 9, furthermore comprising:
    detecting errors in the read data values.

11. A non volatile memory device comprising:
    a memory cell for storing raw data values and generating a raw data signal indicative of the stored raw data values;
    a reference cell for generating a reference signal;
    a read circuit to receive the raw data signal and the reference signal and, based on a comparison of the raw data signal and the reference signal, to generate a data value signal indicating a logical value corresponding to the raw data signal;
    a data error detector circuit to detect errors in the data value signal based on a given error detection technique;
    a reference degrade detector to detect a level of errors detected by the data error detector circuit as exceeding a given threshold; and
    a reference cell rewrite circuit for rewriting the reference cell in response to the reference degrade detector detecting the level of errors exceeding the given threshold.

12. The device of claim 11, wherein said data error detector circuit comprises:
    a data error and correction circuit for correcting detected errors in the read data value signal.

13. The device of claim 11, wherein the memory cell has a given memory cell shape and size providing a first degradation rate and the reference cell has a given reference cell shape and size providing a second degradation rate that is lower than the first degradation rate.

14. The device of claim 13, wherein there are a plurality of memory cells that have the given memory cell shape and size providing a first degradation rate of the memory cell and at least one reference cell that has a given reference cell shape and size providing a second degradation rate lower than the first degradation rate.

15. The device of claim 11, wherein the reference cell has a given susceptibility, and the reference degrade detector comprises:
    a reference test cell having a susceptibility greater than said given susceptibility of the reference cell;
    a reference test cell read circuit for reading values of the reference test cell; and
    a reference test cell error detector capable of detecting test errors in the read values of the reference test cell, wherein the reference test cell error detector determines the reference signal is degraded based on said detecting test errors in the read values of the reference test cell.

* * * * *